United States Patent
Lopez-Julia et al.

(10) Patent No.: US 11,322,669 B2
(45) Date of Patent: May 3, 2022

(54) COLOR UNIFORMITY IN CONVERTED LIGHT EMITTING DIODE USING NANO-STRUCTURES

(71) Applicant: Lumileds LLC, San Jose, CA (US)

(72) Inventors: Antonio Lopez-Julia, Aachen (DE); Venkata Ananth Tamma, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 292 days.

(21) Appl. No.: 16/230,811

(22) Filed: Dec. 21, 2018

(65) Prior Publication Data

US 2020/0203585 A1  Jun. 25, 2020

(51) Int. Cl.
*H01L 33/60* (2010.01)
*H01L 33/50* (2010.01)
*H01L 33/46* (2010.01)

(52) U.S. Cl.
CPC .............. *H01L 33/60* (2013.01); *H01L 33/46* (2013.01); *H01L 33/507* (2013.01); *H01L 2933/0091* (2013.01)

(58) Field of Classification Search
CPC . H01L 33/46; H01L 33/50–508; H01L 33/60; H01L 2933/0091; H01L 2933/0083
See application file for complete search history.

(56) References Cited

U.S. PATENT DOCUMENTS

| | | | |
|---|---|---|---|
| 9,982,850 B2 | 5/2018 | Rodriguez et al. | |
| 2004/0016936 A1* | 1/2004 | Tanaka | H01L 33/20 257/98 |
| 2006/0208273 A1* | 9/2006 | Kang | H01L 33/08 257/103 |
| 2007/0236911 A1* | 10/2007 | Negley | F21K 9/64 362/84 |
| 2007/0257269 A1* | 11/2007 | Cho | H01L 33/60 257/95 |
| 2008/0123339 A1* | 5/2008 | Bierhuizen | F21K 9/60 362/293 |
| 2008/0217639 A1* | 9/2008 | Kim | H01L 33/20 257/98 |
| 2010/0002414 A1* | 1/2010 | Meir | G02B 6/0021 362/84 |

(Continued)

FOREIGN PATENT DOCUMENTS

| | | |
|---|---|---|
| CN | 105810794 A | 7/2016 |
| EP | 3252834 A1 | 5/2017 |

(Continued)

OTHER PUBLICATIONS

English abstractor of CN105810794, Weng, 14 pp, Retrieved from the internet on Dec. 7, 2020: https://dialog.proquest.com/proressional/docview/1809979202?accountid=131444 (Year: 2020).*

(Continued)

*Primary Examiner* — Andres Munoz (57) ABSTRACT

A nano-structure layer is disclosed. The nano-structure layer includes an array of nano-structure material configured to receive a first light beam at a first angle of incidence and to emit the first light beam at a second angle greater than the first angle, the nano-structure material each having a largest dimension of less than 1000 nm.

18 Claims, 11 Drawing Sheets

(56) References Cited

U.S. PATENT DOCUMENTS

| | | | | |
|---|---|---|---|---|
| 2012/0118373 | A1* | 5/2012 | Lee | G02B 5/26 |
| | | | | 136/256 |
| 2013/0000698 | A1* | 1/2013 | Zhou | G02B 5/10 |
| | | | | 136/247 |
| 2014/0378328 | A1* | 12/2014 | Chakravarty | B01J 19/0046 |
| | | | | 506/9 |
| 2016/0111598 | A1* | 4/2016 | Cho | H01L 33/48 |
| | | | | 257/98 |
| 2017/0294419 | A1 | 10/2017 | Nakabayashi et al. | |
| 2017/0309797 | A1 | 10/2017 | De Boer et al. | |
| 2019/0113727 | A1* | 4/2019 | Tamma | F21V 7/0008 |
| 2020/0200955 | A1* | 6/2020 | Lopez-Julia | G02B 1/005 |
| 2020/0203577 | A1* | 6/2020 | Tamma | H01L 33/502 |
| 2020/0203585 | A1* | 6/2020 | Lopez-Julia | H01L 33/60 |
| 2020/0343416 | A1* | 10/2020 | Tamma | G02B 1/005 |

FOREIGN PATENT DOCUMENTS

| | | |
|---|---|---|
| EP | 3252834 A1 | 12/2017 |
| TW | 201235621 A | 9/2012 |
| WO | 2018/067074 A1 | 4/2018 |

OTHER PUBLICATIONS

English translation I of Lin CN105810794, pp. 1-7, retrieved from internet on May 20, 2021: https://patents.google.com/patent/CN105810794A/en?oq=105810794 (Year: 2021).*

English translation II of Lin CN105810794, pp. 1-14, retrieved from internet on May 20, 2021: https://dialog.proquest.com/professional/docview/1808463268/fulltextwithgraphics?accountid=131444 (Year: 2021).*

Abass, Aimi et al., "Insights into directional scattering: from coupled dipoles to asymmetric dimer nanoantennas", Optics Express, vol. 24, No. 17, Aug. 16, 2016, pp. 19638-19650.

International Search Report corresponding to PCT/IB2019/001388, dated Jun. 9, 2020, 4 pages.

Written Opinion of the International Searching Authority corresponding to PCT/IB2019/001388, dated Jun. 9, 2020, 9 pages.

The Extended European Search Report corresponding to EP 19156833, dated Nov. 5, 2019, 12 pages.

European Search Report corresponding to EP Application No. 19156833, dated Jul. 18, 2019, 1 page.

* cited by examiner

COLOR UNIFORMITY IN CONVERTED LIGHT EMITTING DIODE USING NANO-STRUCTURES

BACKGROUND

A typical light-emitting diode (LED) experiences color over source or angle based non-uniformity of emission. In such LEDs, color often varies within a given LED, most significantly as a function of the angle of emitted light from, for example, an active layer that is part of the LED's semiconductor structure. This color-over-angle (CoA) effect can lead to general non-uniformity and may also lead to more noticeable visual phenomenon such as "yellow rings" at large angles in the far-field of a white LED.

COA based non-uniformity can also occur as a result of limited interaction of light emitted by an active layer with a wavelength converting layer. Such limited interaction can occur as a result of light emitted through the wavelength converting at an angle at or close to normal such that the light emission interacts with a minimal number of particles within the wavelength converting layer.

SUMMARY

A nano-structure layer is disclosed. The nano-structure layer includes an array of nano-structure material configured to receive a first light beam at a first angle of incidence and to emit the first light beam at a second angle greater than the first angle, with respect to normal, the nano-structure material each having a largest dimension of less than 1000 nm.

BRIEF DESCRIPTION OF THE DRAWINGS

A more detailed understanding can be had from the following description, given by way of example in conjunction with the accompanying drawings wherein.

DETAILED DESCRIPTION

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available (hereinafter "LEDs"). These LEDs, may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Improvement of color uniformity in LEDs that include one or more wavelength converting layers is disclosed. It will be understood that although white LEDs, blue pump light, and phosphor particles are used herein, they are used as examples only. Notably, disclosure related to white LEDs may be applied to LEDs of one or more other color spectra. Disclosure related to blue pump light may be related to light emitted at one or more other wavelengths. Disclosure related to phosphor particles may be applied to one or more other particles types, layers, or material in general that may provide wavelength converting properties.

Typically, in white LED applications, a pump light (e.g., blue pump) is provided by an active semiconductor layer and the pump light is used to excite particles in a wavelength converting layer which may be a material containing color converters, such as phosphors. The white spectrum in such an LED may be made achieved based on contributions from unconverted, residual, blue pump and converted phosphor light. As an example, a portion of blue pump light emitted by an active layer may traverse through a wavelength converter and may not collide with any wavelength converting particles such that it passes thorough the wavelength converter unaltered. A different portion of the blue pump light emitted by the active layer may traverse through the wavelength converter and may collide with one or more wavelength converting particles (e.g., phosphor particles) such that the resulting light from the collision(s) is a wavelength converted light and may be a more yellow light than the blue pump light that collided with the one or more wavelength converting particles. The combined blue pump light and the converted yellow light may result in the white light output of the LED.

In the example provided above, the spectrum of the converted light can vary depending on the application and can be narrowband or broadband. Similarly, in some cases, the blue light may be chosen to be completely converted to achieve certain colors in the light output by an LED. The wavelength converting layer may broadly be classified as powdered phosphors which consist of micron sized converter particles packed into a silicone film or converters doped into a slab of ceramic material. The light scattering properties of both types of phosphors vary with powdered phosphors being inherently a volume scattering medium whereas the ceramic phosphors can include surface and volume scattering to promote light absorption and conversion.

The scattering within a wavelength converting layer may dictate the path length of the light traversing and getting absorbed within the wavelength converting layer and can lead to over-conversion or under-conversion of blue pump light within the phosphor material. As an example, a high amount of scattering within a wavelength converting layer may correspond to a higher path length, resulting in more collisions (or potential collisions) with wavelength converting particles within the wavelength converting layers. Due to the scattering and conversion properties specific to each type of wavelength converting layer and also to the architecture of the LED package chosen, color over source issues may be experienced in the near or far field. Color over source can be characterized by the lack of color uniformity (relative spectral distribution of different components) over the light emitting surface of a wavelength converting material. Color over source, when projected into the far-field using projection optical elements, results in far-field light spots having color non-uniformity over different angles. Color over source is often referred to as color over angle, which both generally pertain to the same phenomenon. Color non-uniformity can cause undesired optical effects and result in sub-optimal LED performance.

The subject matter disclosed herein is directed to techniques and material to improve color mixing and color uniformity over the surface of a wavelength converting layer by use of photonic nano-structure layers made of nano-structure material such as metasurfaces or metamaterials (e.g., Huygen's metasurfaces), photonic crystals and/or sub-wavelength scatterers.

A nano-structure layer may be implemented with nano-structure material such as meta-molecules (e.g., that create meta-surfaces), photonic crystals, subwavelength scatterers, among others. As used herein, photonic crystals, subwavelength scatterers and meta-surfaces may be periodic arrangements of symmetric or asymmetric meta-molecules and/or nano-antennae. A meta-molecule nano-structure layer may include an array of meta-molecules. A nano-antenna nano-structure layer may include one or more nano-antennae. Nano-structured layers, as disclosed herein, may incorporate the design of LED devices with nano scale optical antennas placed on an LED surface (e.g., a sapphire substrate).

Photonic crystals, subwavelength scatterers and/or meta-surfaces in a nano-structure layer may be purely plasmonic, composed of metal nanoparticles, or metallo-dielectric, composed of metals and dielectric nanoparticles, or purely dielectric, composed of dielectric nanoparticles, typically high index dielectrics. The photonic crystals and/or meta-surfaces in a nano-structure layer may be fabricated using top-down or bottom-up fabrication methods and may utilize nanoparticle self-assembly to provide advantages for manufacturing and scalability. Photonic crystals can be fabricated for one, two, or three dimensions. One-dimensional photonic crystals can be made of layers deposited or stuck together. Two-dimensional ones can be made by photolithography, or by drilling holes in a suitable substrate. Fabrication methods for three-dimensional ones include drilling under different angles, stacking multiple 2D layers on top of each other, direct laser writing, or, for example, instigating self-assembly of spheres in a matrix and dissolving the spheres. The meta-molecules within photonic crystals and/or meta-surfaces in the nano-structure layer may be held together by different techniques including, but not limited to, molecular linkers, DNA, and the like. Alternatively, they may be fabricated by top-down fabrication techniques, such as nano-imprint lithography, nano-sphere lithography, or the like, and individual meta-molecules released using lift-off techniques. A nano-structure layer may be encapsulated by dielectrics such as silicon dioxide or aluminum dioxide to prevent degradation of meta-molecule properties over time.

The design and optimization for steering light in LEDs using a nano-structure layer is disclosed. By way of example and in order to provide concrete description, a flip chip of chip scale package (CSP) LED with a sapphire substrate is described, although the principles and teaching herein may be applied to any applicable LED design. A sapphire based CSP emitter with a smooth light escape surface (LES) may allow deposition of a nano-structured layer such that light emitted by an active layer of the LED is incident upon the nano-structured layer via the sapphire substrate.

According to the subject matter disclosed herein, a nano-structure layer may increase color uniformity by increasing the angle of incident of a light beam that is incident upon the nano-structure layer by steering the incident light towards a higher angle with respect to normal (e.g., from less than 10 degrees to greater than 90 degrees). Alternatively or in addition, the nano-structure layer may increase color uniformity by allowing light above a cutoff angle to pass through the nano-structure layer such that only light incident upon the nano-structure layer at angles that are more likely to increase light path length pass through the nano-structure layer.

FIG. 1 illustrates an LED device 100 including a nano-structure layer 110 on an LED device that includes an epitaxial grown semiconductor layers 130 and substrate 120. The epitaxial grown semiconductor layers 130 may include a first contact 137 and a second contact 138 separated by a gap 133 which may be an airgap or may be filled with dielectric material. A p-type layer 134 may be proximate to an active layer 135 and an n-type layer 139. The active layer 135 of the epitaxial grown semiconductor layers 130 may be configured to emit light distal from the contacts 137 and 138 such that light beams emitted from the active layer 135 are generally emitted towards the substrate 120. The LED device 100 is presented in a simplified form for ease of understanding of the invention, knowing that one possessing an ordinary skill in the pertinent arts would understand the other elements included within an LED.

Figure 1A:
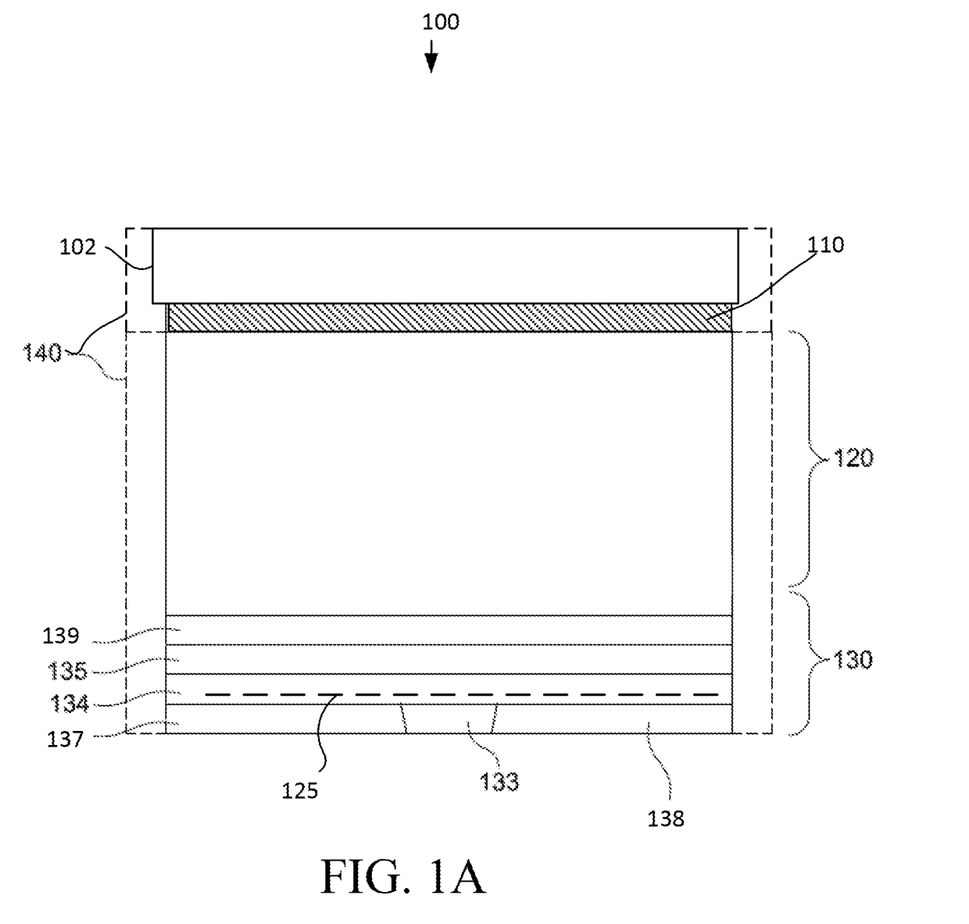
FIG. 1A is a diagram of light emitting device with a nano-structure layer.

The epitaxial grown semiconductor layers 130 may be formed from any applicable material configured to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example materials may have indices of refraction ranging from about 2.4 to about 4.1 at the typical emission wavelengths of LEDs in which they are present.

For example, Aluminum nitride (AlN) may be used and is a wide band gap (6.01-6.05 eV at room temperature) material. AlN may have refractive indices of about 1.9-2.2 (e.g., 2.165 at 632.8 nm). III-Nitride semiconductors, such as GaN, may have refractive indices of about 2.4 at 500 nm, and III-Phosphide semiconductors, such as InGaP, may have refractive indices of about 3.7 at 600 nm. An example gallium nitride (GaN) layer may take the form of a layer of pGaN. As would be understood by those possessing an ordinary skill the pertinent arts, GaN is a binary III/V direct bandgap semiconductor commonly used in light-emitting diodes. GaN may have a crystal structure with a wide band gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN as is used in the present example. The active layer 135 is the region where light is emitted as electroluminescence occurs. Contacts 137 and/or 138 coupled to the LED device 100 may be formed from a solder, such as AuSn, AuGa, AuSi or SAC solders.

As shown in FIG. 1A, substrate 120 may be located between the semiconductor layers 130 and the nano-structured layer 110. The substrate may be a CSP emitter with a smooth LES that enables deposition of the nano-structured layer 110. The substrate 120 may comprise sapphire which is an aluminum oxide (Al2O3) also known as corundum and can exhibit properties including being very hard, strong, easy to machine flat, a good electrical insulator, and an excellent thermal conductor. Sapphire is generally transparent when produced synthetically with the blue color in naturally occurring sapphires (and the red in rubies, which are another form of corundum) comes from impurities in the crystal lattice. In other LEDs, the sapphire may be replaced with gallium nitride (GaN). The semiconductor layers 130 may be in the region where light is emitted as electroluminescence occurs.

As shown in FIG. 1A, the sidewalls of the substrate 120 may be covered by sidewall material 140. The sidewall material 140 may also cover one or more layers of the semiconductor layers 130 such that either the same sidewall material 140 covers the substrate 120 and the semiconductor layers 130 or a different material may cover the sidewalls of the substrate 120 than the semiconductor layers 130. The sidewall material 140 may be any applicable reflecting or scattering material. According to an embodiment, the sidewall material 140 may be a distributed Bragg reflector (DBR).

The nano-structured layer 110 may include photonic materials incorporated into photonic crystals and/or meta-surfaces which may include meta-molecule and/or nano-antennae such that the largest dimension for a meta-molecule or nano-antennae is less than 1000 nm. The nano-antennae can be implemented as an array of nanoparticles located in the nano-structure layer, as further disclosed herein. The nano-antennas may be arranged in either periodic or a-periodic patterns, as further disclosed herein. In analogy with chemical molecules composed of atoms, a meta-surface is composed of meta-molecule with the meta-molecules combined together and interacting to give the meta-surface unique optical properties. The size of individual meta-surfaces may be sub-wavelength or may be formed at the same order of wavelength of use.

The nano-structured layer 110 can also include nano-antennae that are distributed throughout a host dielectric medium. The sizes of the nano-antennae may be a sub-wavelength of order of wavelength.

As disclosed herein, to promote a longer light path for light that traverses through wavelength converting layer 102, a nano-structure layer 110 may create an angular filter that transmits lights at angles greater than an angular cut-off angle and reflects radiation below the angular cut-off angle, with respect to normal. As a result, only light beams that are incident upon the nano-structure layer 110 at a high angle (e.g., not normal or close to normal) traverses through the nano-structure layer 110. Given the high angle, the light path of such light beams is longer than, for example, light beams that would otherwise be incident upon the wavelength converting layer 102 at a lower (e.g., at normal or near normal) angle.

As disclosed herein, light beams incident upon a nano-structure layer 110 of FIG. 1A may reflect back into the substrate 120 such that the reflected beams are incident upon the sidewall material 140 and/or a back reflector 125 located below the active layer 135 and distal from the surface of the substrate 120 that faces the nano-structured layer 110. The back reflector 125 may be a plasmonic layer including planar metal mirrors, a distributed Bragg reflector (DBR) and/or other known LED reflectors. The back reflector 125 is designed to re-reflect the light beams that are reflected back into the substrate 120. The back reflector 125 may reflect light beams before or after the light beams bounce off sidewall material 140 or may reflect light beams directly reflected by the nano-structured layer 110.

Figure 1B:
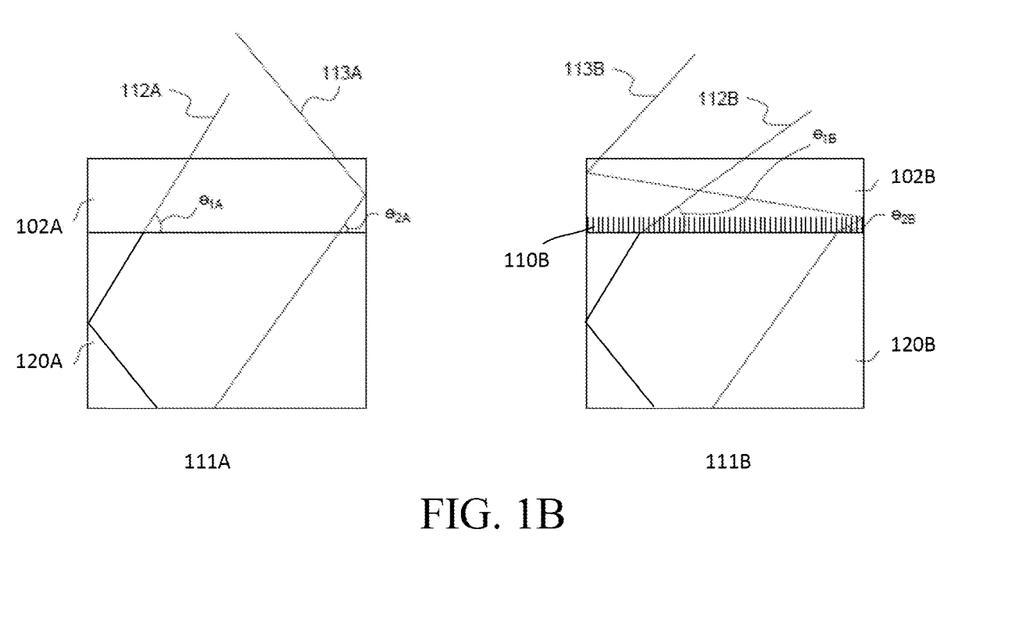
FIG. 1B is a diagram showing light emission with and without a nano-structure layer.

FIG. 1B shows an example of light steering via a nano-structure layer. LED device 111A is shown with a substrate 120A and wavelength converting layer 102A. Light beam 112A and 113A traverse through the substrate 120A and are incident upon the wavelength converting layer 102A at angles $\theta_{1A}$ and $\theta_{2A}$ respectively. LED device 111B is shown with a substrate 120B, wavelength converting layer 102B, as well as a nano-structure layer 110B in accordance with the disclosed subject matter. Light beam 112B and 113B traverse through the substrate 120B with the same optical properties (e.g., angle, frequency, direction) as light beams 112A and 113A as they traversed through substrate 120A which is similar to or the same as substrate 120B. Light beams 112B and 113B are incident upon the wavelength converting layer 102B after traversing through the nano-structure layer 110B. As shown, light beams 112B and 113B are steered within the nano-structure layer 110B such that they are incident upon the wavelength converting layer 102B at angles $\theta_{1B}$ and $\theta_{2B}$ respectively. It will be noted that angles $\theta_{1B}$ and 02B are greater than angles $\theta_{1A}$ and $\theta_{2A}$ with respect to normal. To clarify, the nano-structure layer 110B steers light beams incident upon the nano-structure layer 110B such that the enter the wavelength converting layer 102B at an angle greater than if the nano-structure layer 110B did not steer the light beams (i.e., the example of wavelength converting layer 102A). As a result, the path length of light emitted through the wavelength converting layer 1028 is greater than the path length of light emitted through wavelength converting layer 102A, and, accordingly, the light beams 112B and 113B are more likely to collide with particles within wavelength converting layer 102B, effectively increasing the chance of conversion, providing color uniformity.

Figure 1C:
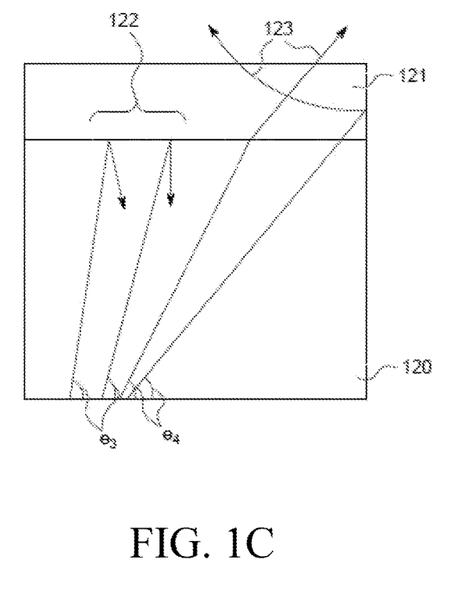
FIG. 1C is a diagram showing light emission with a nano-structure layer.

According to an embodiment, as disclosed herein, the nano-structure layer 110 of FIG. 1A may reflect light beams incident upon the nano-structure layer 110 at an angle less than a cutoff angle. An example visual representation of this phenomenon is shown in FIG. 1C by light beams 122 and 123. Light beams 122 and 123 may traverse the substrate 120 and be incident upon the nano-structure layer 121. Nano-structure layer 121 may be configured such that light beams incident at an angle below a given cutoff angle are reflected back and light beams above the cutoff angle are transmitted through the nano-structure layer (e.g., into a wavelength converting layer). Light beams 122 may be incident at an angle $\theta_3$ of incidence which may be angle below a cut off angle (i.e., closer to normal) such that the nano-structure layer reflects the light beams 122, as shown. Light beams 123 may be incident upon nano-structure layer 121 at an angle $\theta_4$ of incident which is higher than the cut off angle (i.e., is further away from normal) and may traverse through the nano-structure layer 121 as shown. According to the disclosed subject matter, the light beams 123 may experience light steering within the nano-structure layer 121. As disclosed herein, light beams reflected back into the substrate 120 may experience one or more bounces within the substrate and/or on a back reflector such that they may be incident upon the nano-structure layer 121 a second time after being reflected into the substrate 120 by the nano-structure layer 121. A light beam that is reflected into the substrate by the nano-structure layer 121 at a first time may experience one or more bounces within the substrate (e.g., at the sidewall material, back reflector, etc.) and may be incident upon the nano-structure layer 121 at a second time after the first time. The angle of incidence of the light beam, at the second time, may be higher than the cut off angle and, accordingly, the light beam may pass through the nano-structure layer 121.

Figure 1D:
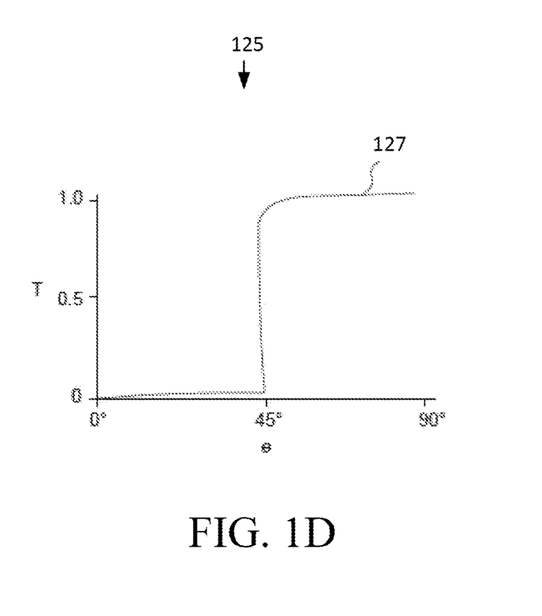
FIG. 1D is a chart showing transmission as a function of angle.

FIG. 1D shows the phi averaged transmission 127 versus angle plot for a nano-structure layer from the example light beam interaction with nano-structure layer 121, as described for FIG. 1C. As shown, the configuration of the nano-structure layer 121 enables a unity or near unity transmission after cutoff angle of approximately 45 degrees and does not permit transmission (e.g., reflects light beams) before the cutoff angle.

Figure 1E:
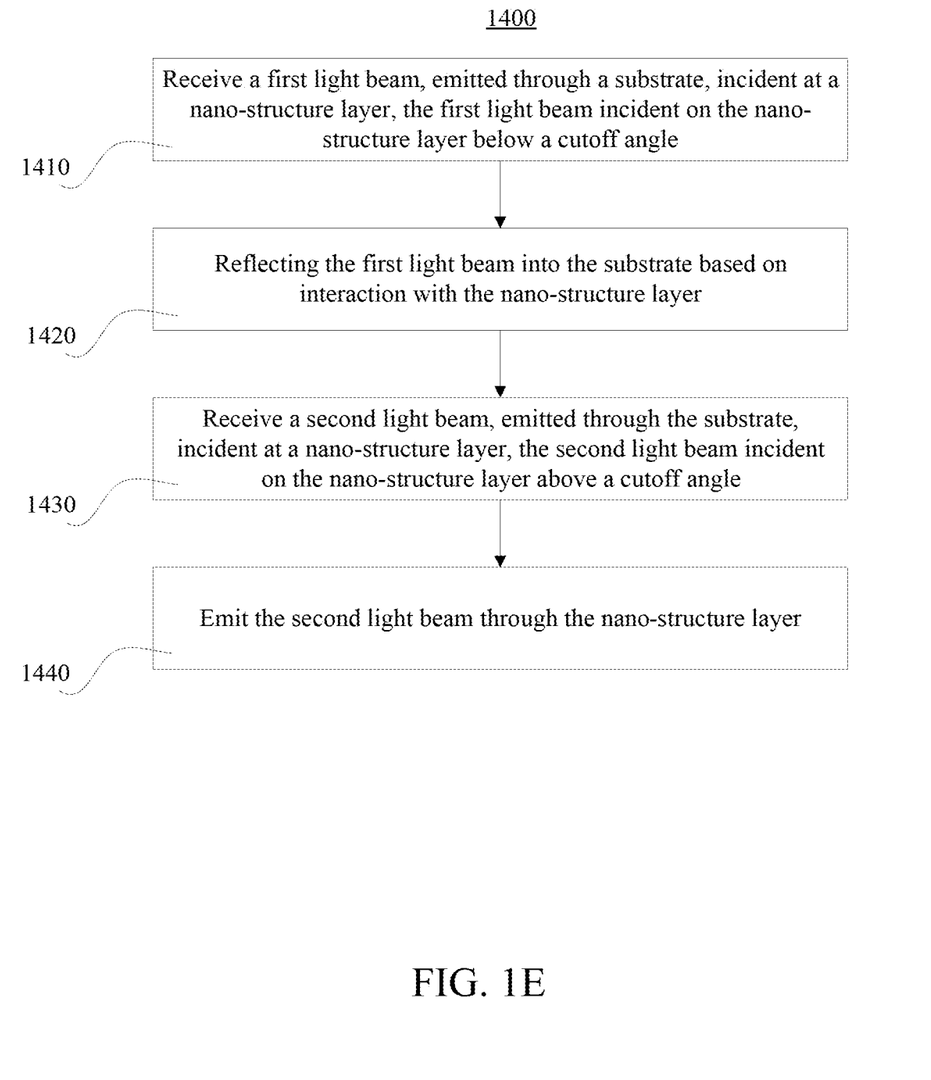
FIG. 1E is flow diagram for light emission with a nano-structure layer.

FIG. 1E shows an example process 1400 of a beam transmission through substrate 120 and nano-structure layer 110 of FIG. 1A (note that this process could also apply to the nano-structure layer 121 of FIGS. 1C and 1D). At step 1410, a first light beam may be incident upon the nano-structure layer 110 after traversing through substrate 120. The first light beam may be incident at an angle below the nano-structure layer 110's cutoff angle. At step 1420, the first light beam may be reflected back into the substrate 120 based on the interaction with the nano-structure layer 110 at an angle below the cutoff angle. At step 1430, a second light beam maybe incident upon the nano-structure layer 110 through the substrate 120. The second light beam may be incident at an angle above the nano-structure layer 110's cutoff angle. At step 1440, the second light beam may be emitted through the nano-structure layer 110 based on its interaction with the nano-structure layer 110 at an angle above the cutoff angle. According to an embodiment, as discussed herein, the first light beam may bounce off one or more inside surfaces of the substrate, sidewall material and/or back reflector and may then be incident upon the nano-structure layer 110 at an angle above the cutoff angle. The first light beam may then be emitted through the nano-structure layer 110 based on the angle of incident above the cutoff angle.

Nano-structure layer configurations will be discussed further herein.

Figure 1F:
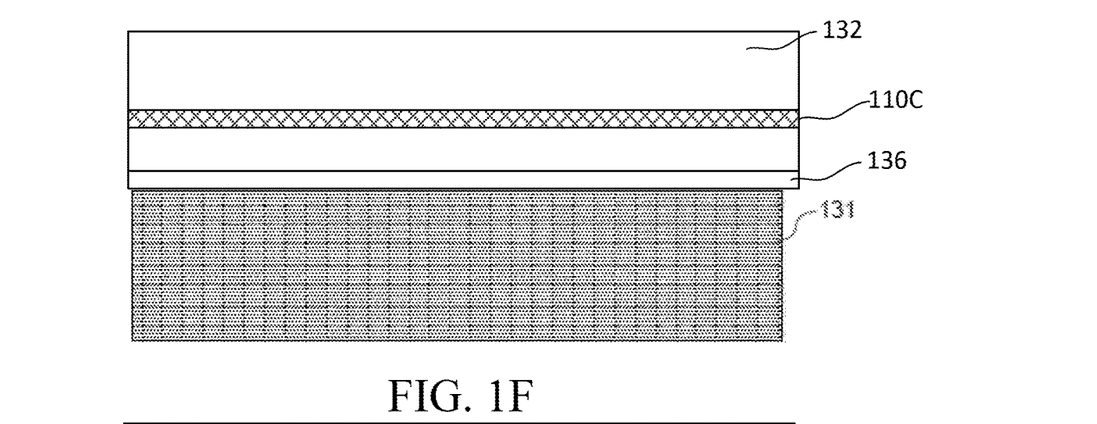
FIG. 1F is a structure with a nano-structure layer.
Figure 1G:
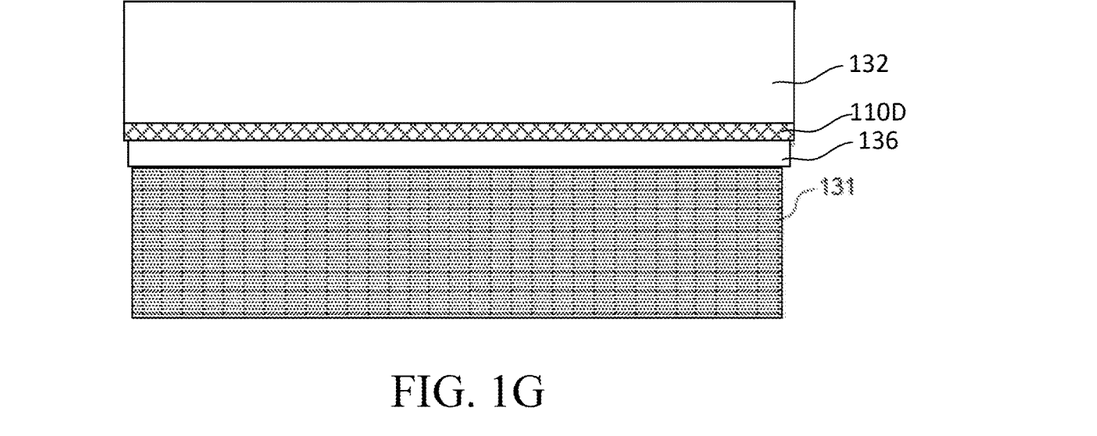
FIG. 1G is another structure with a nano-structure layer.
Figure 1H:
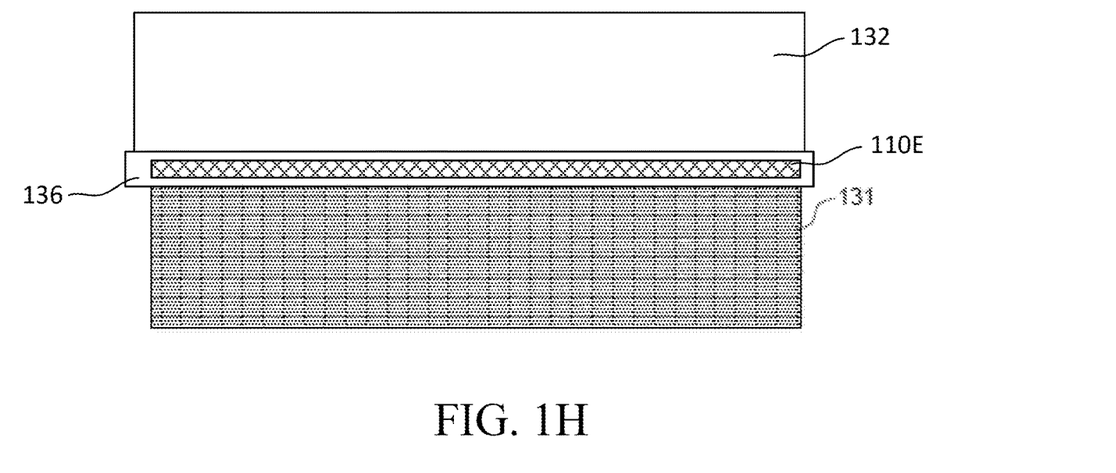
FIG. 1H is another structure with a nano-structure layer.

FIGS. 1F-1H shows different configurations of nano-structure layers 110C, 110D, and 110E in accordance with subject matter herein. FIG. 1F shows a substrate 131, an adhesive layer 136, and a wavelength converting layer 132. A nano-structure layer 110C is disposed within the wavelength converting layer 132 between a first surface and a second surface of the wavelength converting layer 132 such that the first surface and second surface are planar to the substrate 131. FIG. 1G shows a substrate 131, an adhesive layer 136, and a wavelength converting layer 132. A nano-structure layer 110D is disposed on a surface of the wavelength converting layer 132, the surface proximate to the substrate 131. FIG. 1G shows a substrate 131, an adhesive layer 136, and a wavelength converting layer 132. A nano-structure layer 110E is disposed between the substrate 131 and wavelength converting layer 132 such that it is disposed within the adhesive layer 136.

As disclosed herein, photonic nano-structure layer is structured such that is transmits radiation incident upon a wavelength converting layer after bending the angle of light towards a chosen direction (e.g., to a greater angle than the angle of incident). For example, for an application with ceramic phosphors, light incident normally on a nano-structure layer may bend to larger deflection angle within the phosphor layer, with respect to normal. This results in the light path length for such light to increase, causing increased conversion and improvement in color mixing and color uniformity. The deflection angle of the nano-structure layer and the distribution of nano-structures within the nano-structure layer can be chosen to optimize the color mixing and color uniformity, as disclosed herein.

A nano-structure layer configured in accordance with a Huygen's metasurface can include of nano-cylinders, nano-cones or nano-cuboids arranged in either hexagonal or rectangular lattice. The lattice period can be sub-wavelength or larger than wavelength. These nano-structures can be chosen to satisfy a first Kerker's conditions so that the magnetic and electric dipole radiation cancels in the backward direction yielding a large forward scatter. For nano-antenna including either a vertical dimer and/or coaxial dimer, interfering modes may be provided within respective meta-molecules that provide better control of the scattered modes using structural parameters.

Figure 1I:
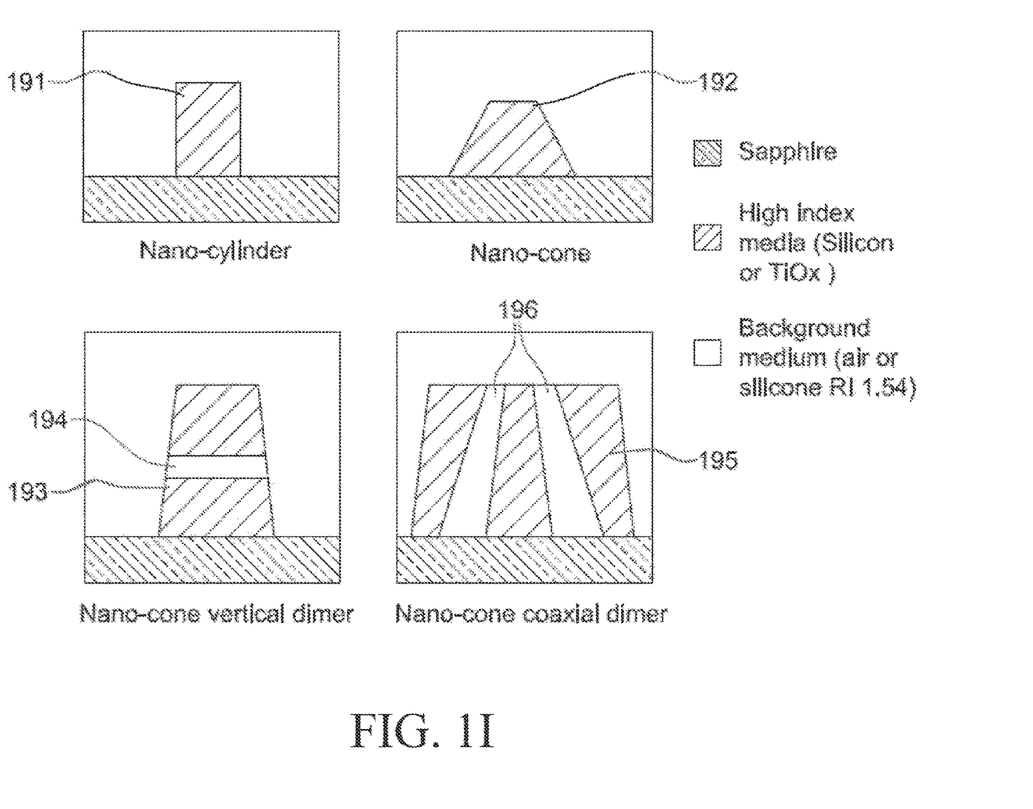
FIG. 1I is a diagram of different nano-antennae.

FIG. 1I illustrates various cross-sections of some different possible nano-antennae. The nano-antenna may be high index media, such as silicon or TiOx. The nano-antenna may be formed from nano-cylinders 191, nano-cones 192, or nano-cone 193 and 195 with vertical or coaxial dimers, arranged in either hexagonal or rectangular lattice. The lattice period may be sub-wavelength or larger than wavelength. The nano-antennae may be Huygen's meta-molecules and/or support waveguide modes. The background medium the nano-antennae is disposed in may be air or silicone with refractive index (RI) 1.54. The substrate the nano-antennae are disposed on may be sapphire. Each photonic crystal or meta-surface may present a certain amount of beam bending properties such that incident beams can be shaped to the required angular distribution.

Figure 1J:
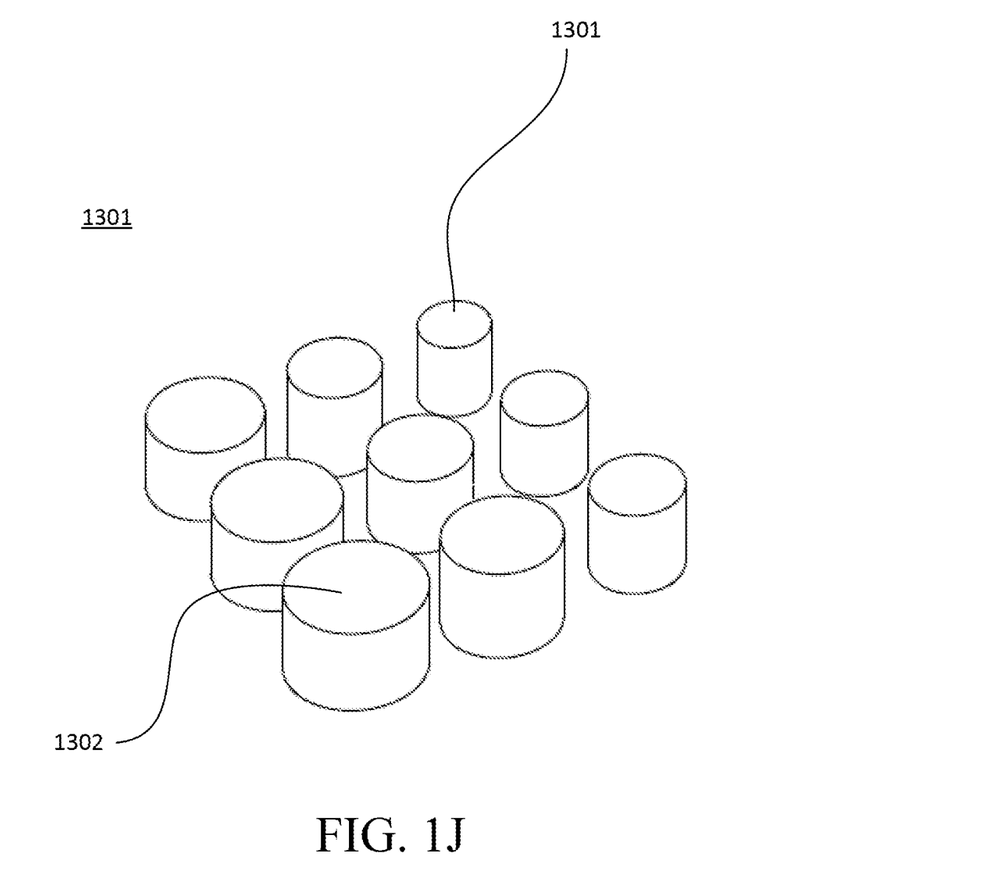
FIG. 1J is a multi nano-structure material array.
Figure 1K:
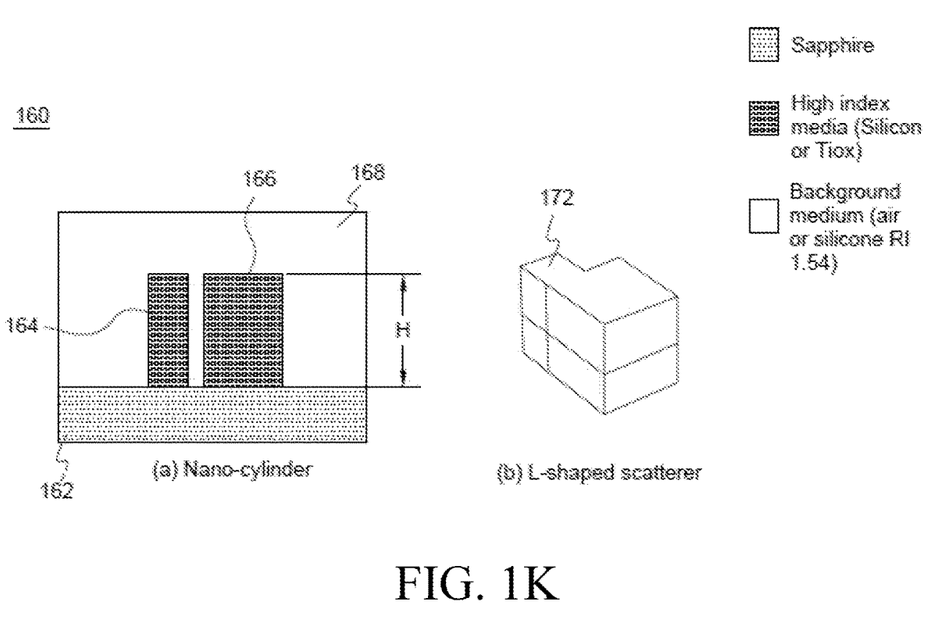
FIG. 1K is another is a diagram of different nano-antennae.

As an alternative configuration example, FIG. 1K shows sub-wavelength gratings formed from asymmetric scatterers 164 and 172. Asymmetric scatterer 168 includes two nano-cylinders 164 and 166 with a height H on a substrate 162. As shown, the scatterer 168 is asymmetric such that the nano-cylinders 164 and 166 are not the same size/shape. Array of scatterers 168 may create a nano-scatter layer such that the array includes multiple copies of scatterer 168. Scatterer 172 is an L-shaped scatterer with one side of the scatterer 172 larger than another side of the scatterer 172. Array of scatterers 168 may create a nano-scatter layer such that the array includes multiple copies of scatterer 168 and/or 172. These sub wavelength scatterers may scatter light incident at normal incidence to large oblique angles. Asymmetric nano-structures (e.g., 168, 172) can be chosen to be arrayed in a 2-dimensional grating. The design and placement of these nano-structures may be directed to achieve the best possible color mixing and color uniformity.

Further, the nano-antennae may be configured in an arrangement that establishes a given cutoff angle such that light incident above the cutoff angle passes through the nano-antennae, and thus the nano-structure layer, and light incident below the cutoff angle does not pass or is reflected back.

Nano-antennae may be formed or arrayed as single nano-photonic structures such that the same nano-antenna is repeated numerous times to form a nano-structured layer. Alternatively or in addition, nano-antennae may be formed or arrayed as multi nano-structure material such that an array of nano-antennae is repeated numerous times to form a nano-structured layer. FIG. 1J illustrates an example multi nano-structure material 1300. As shown, the multi nano-structure material 1300 includes nano-cylinders 1301 and 1302 such that the different nano-cylinders 1301 and 1302 have one or more different properties when compared to each other. As a visual example, as shown in FIG. 1J, nano-cylinder 1301 is smaller in volume than the nano-cylinder 1302. These multi nano-structures may be arrayed such that a nano-structure layer 110 includes multiple iterations of multi nano-structure materials 1300. Each small multi nano-structure material 1300 of a nano-structure layer 110 may provide beam bending to the light incident on nano-structure layer 110. By suitably placing a multitude of different nano-cylinders 1301, with different beam bending properties, within a multi nano-structure material 1300 within nano-structure layer 110, light incident upon nano-structure layer 110 may be shaped to present a certain amount of beam bending properties or to obtain a predetermined or preferred angular distribution. The design and placement within nano-structure layer 110 of FIG. 1A may be selected by an optimizer to obtain the best possible flux from the LED device 100 of FIG. 1A.

The design of photonic crystals and/or meta-surfaces may be dictated by the required beam bending or angular distribution and the placement of the same can be determined based on an optimizer to obtain the best possible color mixing and color uniformity.

Figure 2A:
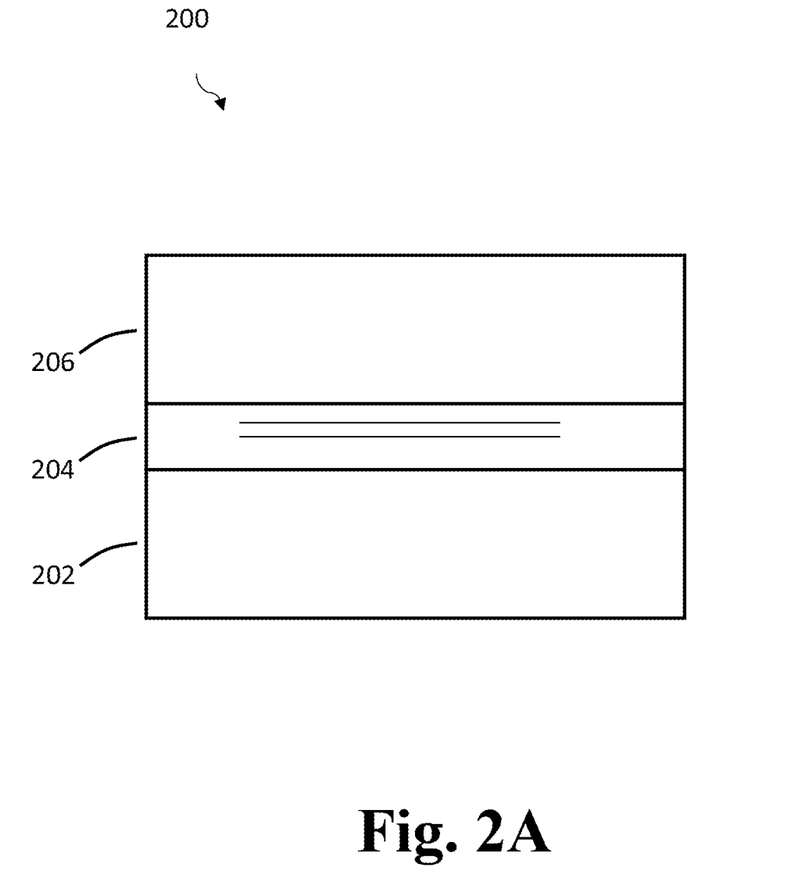
FIG. 2A is a diagram showing an Light Emitting Diode (LED) device.

FIG. 2A is a diagram of an LED device 200 in an example embodiment. The LED device 200 may include one or more epitaxial layers 202, an active layer 204, and a substrate 206. In other embodiments, an LED device may include a wavelength converter layer and/or primary optics. As shown in FIG. 2A, the active layer 204 may be adjacent to the substrate 206 and emit light when excited. The epitaxial layers 202 may be proximal to the active layer 204 and/or one or more intermediate layers may be between the active layer 204 and epitaxial layers 202. The substrate 206 may be proximal to the active layer 204 and/or one or more intermediate layers may be between the active layer 204 and substrate 206. The active layer 204 emits light into the substrate 206. A nano-structure layer may be placed on the substrate 206 such that light incident upon the nano-structure layer is bent by the nano-structure layer or is filtered by the nano-structure layer such that only light beams above a cutoff angle, with respect to normal, are emitted through the nano-structure layer.

Figure 2B:
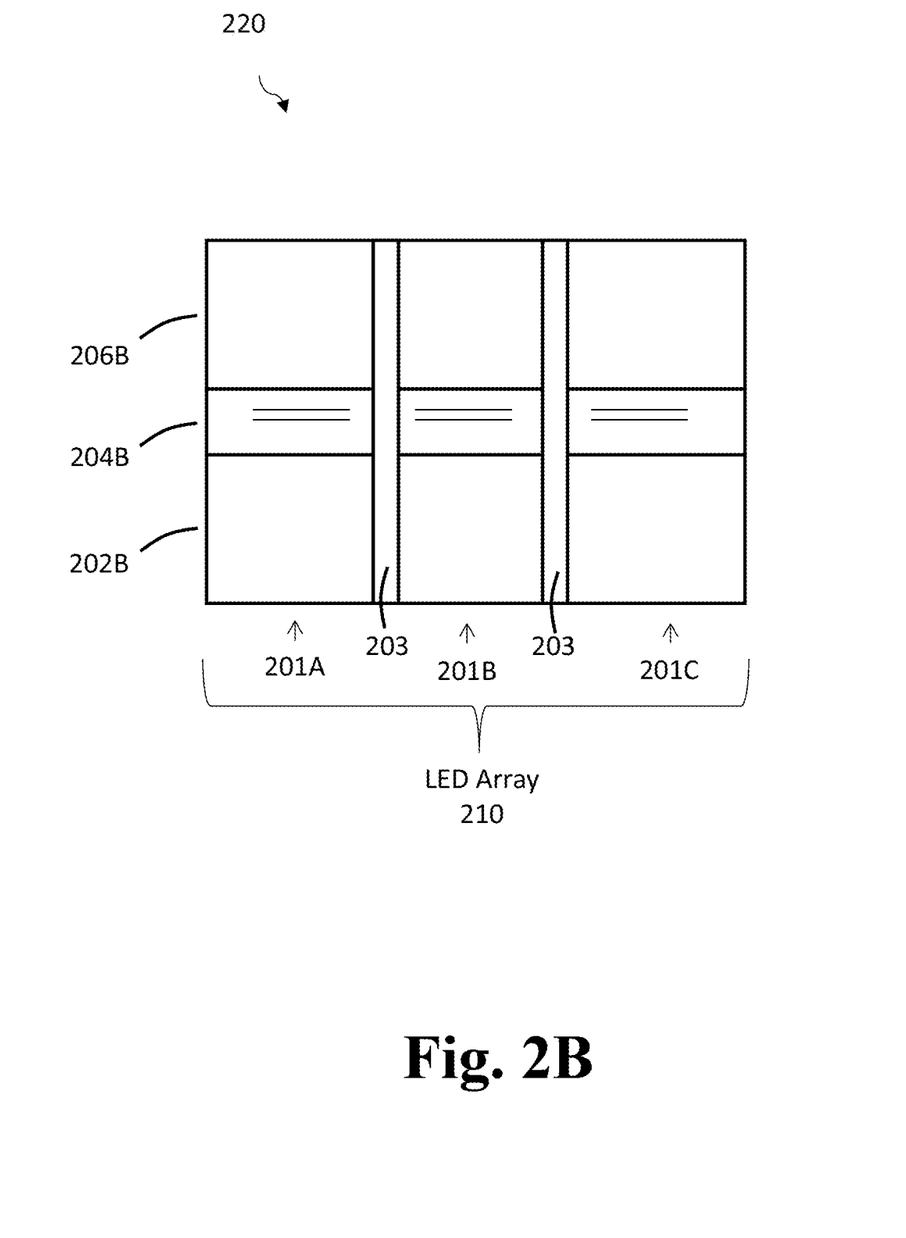
FIG. 2B is a diagram showing multiple LED devices.

FIG. 2B shows a cross-sectional view of a lighting system 220 including an LED array 210 with pixels 201A, 201B, and 201C. The LED array 210 includes pixels 201A, 201B, and 201C each including a respective substrate 206B active layer 204B and an epitaxial layer 202B. Pixels 201A, 201B, and 201C, in the LED array 210 may be formed using array segmentation, or alternatively using pick and place techniques and may, for example, emit light at different peak wavelengths such as red, green, and blue. The spaces 203 shown between one or more pixels 201A, 201B, and 201O may include an air gap or may be filled by a material such as a metal material which may be a contact (e.g., n-contact). According to some embodiments, secondary optics such as one or more lenses and/or one or more waveguides may be provided.

The LED device 200 or pixels 201A, 201B, and 201C may be single wavelength emitters and may be powered individually or via as an array. The LED device 200 or pixels 201A, 201B, and 201C may be part of an illumination system that includes one or more electronics boards, power modules, sensors, connectivity and control modules, LED attach regions, or the like. Pixels in an array may be powered based on different channel signals and their operation may be determined by a microcontroller.

Figure 3:
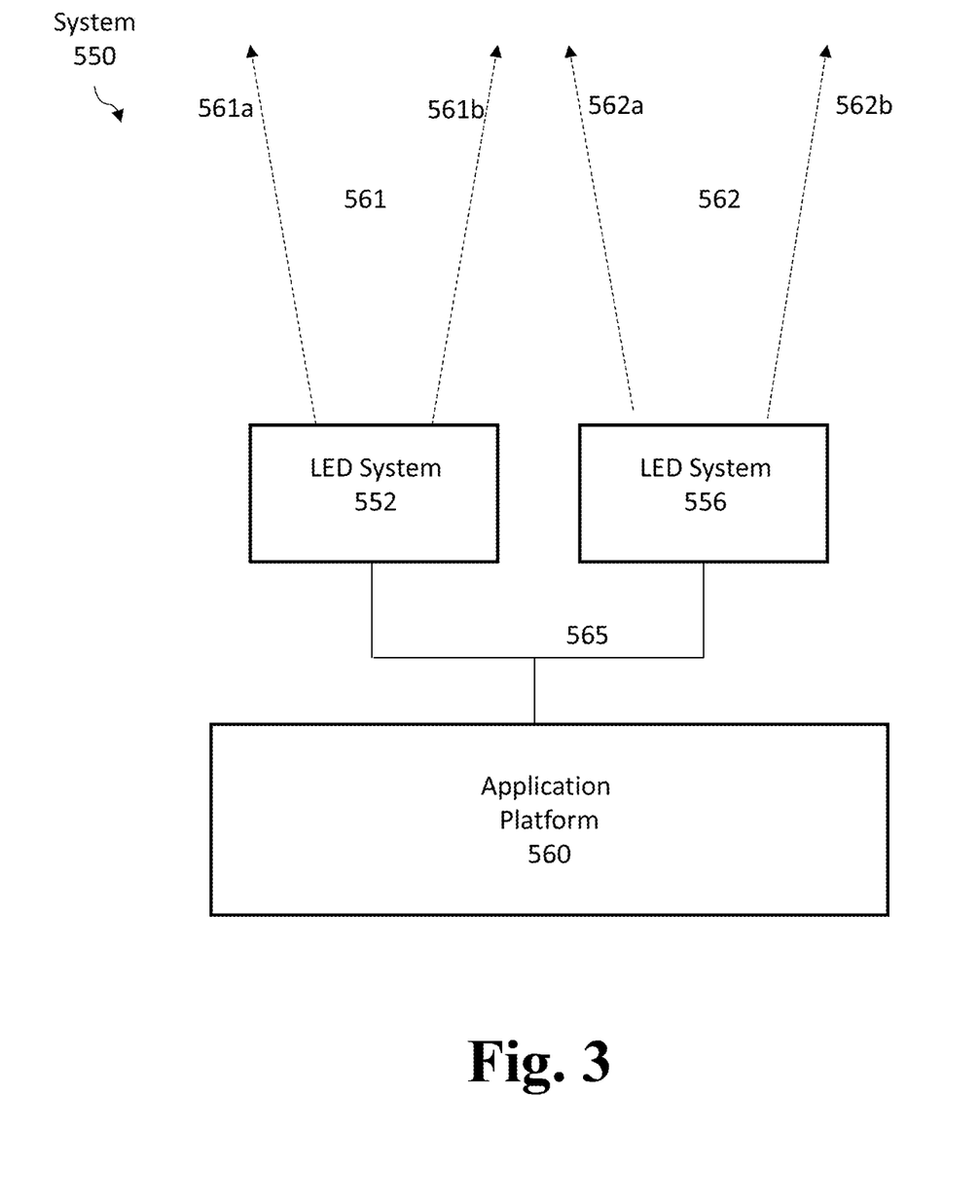
FIG. 3 is a diagram of an example application system.

FIG. 3 shows an example system 550 which includes an application platform 560 and LED systems 552 and 556. The LED system 552 produces light beams 561 shown between arrows 561a and 561b. The LED system 556 may produce light beams 562 between arrows 562a and 562b. As an example embodiment, the LED system 552 and 556 may be part of an automobile and may emit infrared (IR) light communication beams such that an oncoming vehicle in the path of the light beams 561 and/or 562 is able to receive communication from the automobile. In example embodiments, the system 550 may be a mobile phone of a camera flash system, indoor residential or commercial lighting, outdoor light such as street lighting, an automobile, a medical device, AR/VR devices, and robotic devices.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VC-SEL). The one or more sensors may sense a response to the emitted beam or any other applicable input.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting device comprising:
    a semiconductor diode structure that in operation emits a first light comprising light rays;
    a substrate transparent to the first light and comprising a top surface, a bottom surface oppositely positioned from the top surface, and side surfaces connecting the top surface and the bottom surface, the bottom surface disposed on or adjacent the semiconductor diode structure;
    a wavelength converting structure comprising a top surface and an oppositely positioned bottom surface disposed on or adjacent the top surface of the substrate; and
    a Huygen's metasurface comprising nanoantennas having a spatial variation in radius, the Huygen's metasurface positioned between the top surface of the substrate and the top surface of the wavelength converting structure and in operation transmits the light rays into the wavelength converting structure at an angle with respect to the Huygen's metasurface greater than an angle of incidence of the light rays on the Huygen's metasurface, the semiconductor diode structure in operation emits the light rays of first light to be incident on the Huygen's metasurface from a substrate side of the Huygen's metasurface.

2. The light emitting device of claim 1, wherein the Huygen's metasurface is disposed on or adjacent the bottom surface of the wavelength converting structure.

3. The light emitting device of claim 1, wherein the Huygen's metasurface is disposed within the wavelength converting structure.

4. The light emitting device of claim 1, wherein the nanoantennas together comprise a periodic lattice.

5. The light emitting device of claim 4, wherein the periodic lattice is a hexagonal lattice.

6. The light emitting device of claim 4, wherein the periodic lattice is a rectangular lattice.

7. The light emitting device of claim 4, wherein a lattice period of the periodic lattice is less than a wavelength of the first light.

8. The light emitting device of claim 4, wherein a lattice period of the periodic lattice is greater than a wavelength of the first light.

9. The light emitting device of claim 1, wherein the nanoantennas each have a largest dimension less than a wavelength of the first light.

10. The light emitting device of claim 1, wherein at least one of the nanoantennas is an asymmetric object.

11. The light emitting device of claim 1, wherein at least one nanoantenna comprises two or more light scattering objects.

12. The light emitting device of claim 11, wherein the two or more light scattering objects are symmetric objects.

13. The light emitting device of claim 12, wherein the two or more light scattering objects are in an asymmetrical arrangement.

14. The light emitting device of claim 1, wherein the Huygen's metasurface has a top surface of the Huygen's metasurface that is not in direct contact with the wavelength converting structure.

15. The light emitting device of claim 1, further comprising an adhesive layer between the substrate and the wavelength converting structure and having a top surface, a bottom surface, and side surfaces connecting the top surface and the bottom surface, the top surface of the adhesive layer being a different surface from a top surface of the Huygen's metasurface.

16. The light emitting device of claim 1, wherein the nanoantennas are nano-cylinders.

17. The light emitting device of claim 1, wherein the nanoantennas are nano-cones.

18. The light emitting device of claim 1, wherein the nanoantennas are nano-cuboids.

* * * * *